(12) United States Patent
Lowe

(10) Patent No.: US 6,939,447 B2
(45) Date of Patent: Sep. 6, 2005

(54) METHOD OF PROVIDING CONDUCTIVE TRACKS ON A PRINTED CIRCUIT AND APPARATUS FOR USE IN CARRYING OUT THE METHOD

(75) Inventor: John Michael Lowe, Leicestershire (GB)

(73) Assignee: TDAO Limited (GB)

( * ) Notice: Subject to any disclaimer, the term of this patent is extended or adjusted under 35 U.S.C. 154(b) by 245 days.

(21) Appl. No.: 10/367,362

(22) Filed: Feb. 14, 2003

(65) Prior Publication Data

US 2003/0173225 A1 Sep. 18, 2003

Related U.S. Application Data

(63) Continuation-in-part of application No. 09/679,577, filed on Oct. 5, 2000, now Pat. No. 6,524,462, which is a continuation of application No. PCT/GB99/00890, filed on Apr. 6, 1999.

(30) Foreign Application Priority Data

Apr. 6, 1998 (GB) .............................................. 9807280

(51) Int. Cl.⁷ ............................. C25D 5/02; C25D 19/00
(52) U.S. Cl. ................... 204/224 R; 204/207; 204/211; 204/227; 204/230.2; 205/91; 205/118; 205/125
(58) Field of Search .................................. 204/207, 211, 204/224 R, 227, 230.2; 205/91, 118, 125

(56) References Cited

U.S. PATENT DOCUMENTS

| | | | | |
|---|---|---|---|---|
| 2,744,859 A | * | 5/1956 | Rines | .......................... 205/118 |
| 3,506,545 A | * | 4/1970 | Nowick et al. | ............. 205/125 |
| 3,755,089 A | | 8/1973 | Rapids | |
| 4,159,934 A | | 7/1979 | Kadija | |
| 4,220,504 A | | 9/1980 | Hanley et al. | |
| 4,270,986 A | | 6/1981 | Smith | |
| 4,304,654 A | | 12/1981 | Norris | |
| 4,385,968 A | | 5/1983 | Gaston | |
| 4,481,081 A | | 11/1984 | Doubt | |
| 4,564,430 A | | 1/1986 | Bacon | |
| 4,592,808 A | | 6/1986 | Doubt | |
| 4,595,464 A | | 6/1986 | Bacon | |
| 4,655,881 A | | 4/1987 | Tezuka | |
| 4,786,389 A | | 11/1988 | Moffitt | |
| 4,800,001 A | | 1/1989 | Ott | |
| 4,911,796 A | | 3/1990 | Reed | |
| 5,002,649 A | | 3/1991 | Smith | |
| 5,024,735 A | | 6/1991 | Kadija | |
| 5,409,593 A | | 4/1995 | Moskowitz | |
| 5,599,595 A | | 2/1997 | McGinley | |
| 5,688,146 A | | 11/1997 | McGinley | |
| 5,713,233 A | | 2/1998 | McCarthy | |
| 5,785,838 A | * | 7/1998 | Sugimura et al. | ............. 205/83 |

FOREIGN PATENT DOCUMENTS

DE          934 620 C      10/1955
DE       36 03 3856 A1      8/1987

(Continued)

OTHER PUBLICATIONS

DALIC Metallisation Electrochimique Selective Plating http://www.dalicworld.com/histogb.htn. Mar. 30,1998.

(Continued)

Primary Examiner—Roy King
Assistant Examiner—William T. Leader
(74) Attorney, Agent, or Firm—DLA Piper Rudnick Gray Cary US LLP

(57) ABSTRACT

A method of electro-plating comprises providing an anode current for a target, applying an electron beam to the surface of a target and passing electrolyte between said target and anode, thereby to deposit material on said target. An electron beam gun directs an electron beam onto web while anode provides a current thereby depositing material on the web.

11 Claims, 7 Drawing Sheets

FOREIGN PATENT DOCUMENTS

| | | |
|---|---|---|
| DE | 20 636 32 | 1/2000 |
| EP | 00 491 92 | 4/1982 |
| EP | 0307611 | 3/1992 |
| FR | 25 333 56 | 3/1984 |
| FR | 25 334 29 | 3/1984 |
| FR | 25 740 95 | 6/1986 |
| FR | 26 931 29 | 1/1994 |
| FR | 27 140 80 | 6/1996 |
| FR | 21 760 36 | 1/2000 |
| GB | 574 946 A | 1/1946 |
| GB | 1077867 | 8/1967 |
| GB | 1175613 | 12/1969 |
| GB | 1556226 | 11/1979 |
| GB | 20 606 99 | 5/1981 |
| GB | 2191624 A | 1/1988 |
| GB | 2234525 A | 2/1991 |
| JP | 56142698 A | 11/1981 |
| JP | 61 124 89 | 6/1987 |
| JP | 63 297587 | 12/1988 |
| JP | 82 960 84 | 11/1996 |
| SU | 487164 | 1/1976 |
| WO | WO 79/00608 | 8/1979 |
| WO | WO 91/09511 | 6/1991 |
| WO | WO 97/36464 | 10/1997 |

OTHER PUBLICATIONS

DALIC Metallisation Electrochimique Selective Plating http://www.dalicworld.com/grgb.htn. Mar. 30, 1998.

SIFCO What is Brush Plating http://www.sifco–sp.com/applications.htn Mar. 30, 1998.

Brooktronics Engineering Corporation—What is Brush Plating http://www.brooktronics.com/whatsbhp.h Mar. 30, 1998.

SIFCO—Brush Plating Applications http://.sifco–sp.com/applications.htn. Mar. 30, 1998.

Reference Manual on the Installation and Adjustment of Radio–Electronic Apparatus, I.M. Zarkh, Lenizdat 1965 (w/English translation).

* cited by examiner

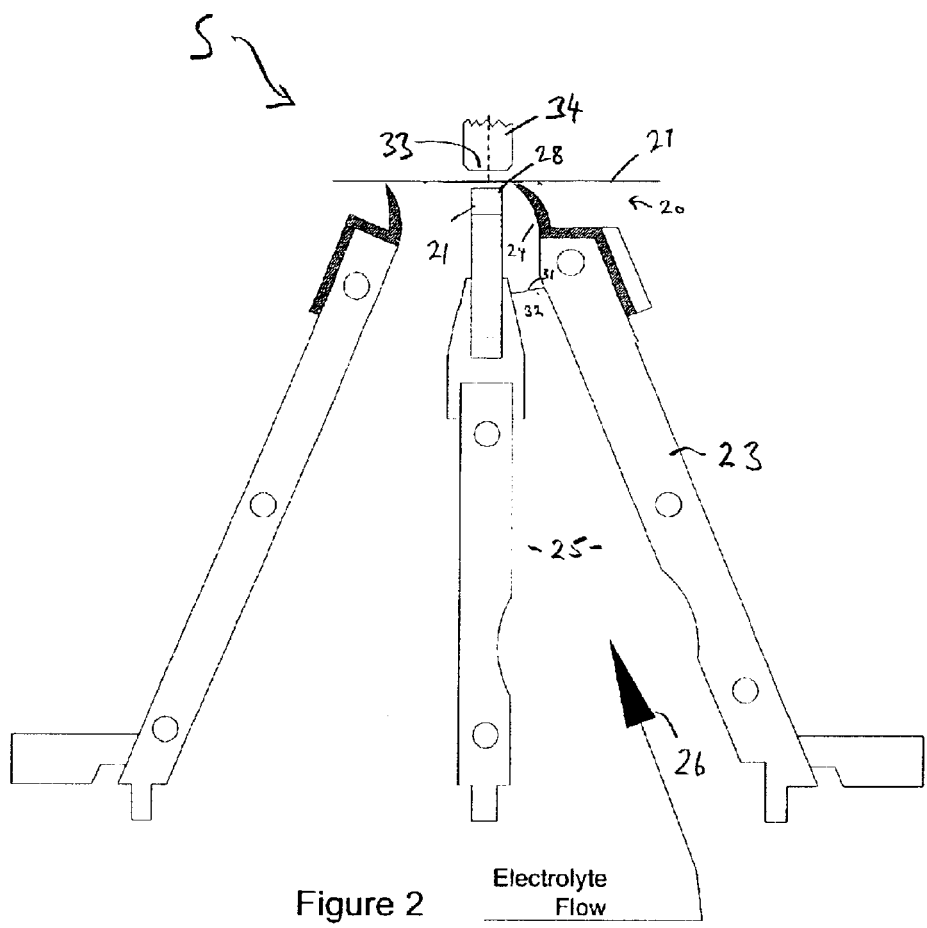
Figure 2 — Electrolyte Flow

METHOD OF PROVIDING CONDUCTIVE TRACKS ON A PRINTED CIRCUIT AND APPARATUS FOR USE IN CARRYING OUT THE METHOD

RELATED APPLICATION

This is a continuation-in-part of U.S. Ser. No. 09/679,577 filed Oct. 5, 2000 now U.S. Pat. No. 6,524,462, which is a continuation of International Application No. PCT/GB99/00890, with an international filing date of Apr. 6, 1999, which is based on British Patent Application No. 9807280.4, filed Apr. 6, 1998.

FIELD OF THE INVENTION

This invention is concerned with a method of providing conductive tracks on a printed circuit and an apparatus suitable for use in carrying out the method.

BACKGROUND

A well known and convenient way of producing printed circuits includes the printing of electrically conductive tracks on a substrate, for example, using screen printing techniques. The tracks are printed using an electrically conductive ink which typically comprises a polymeric material having electrically conductive particles, for example, copper, silver or other suitable metal, dispersed in the polymeric composition. The polymeric materials are typically cured to a solid condition by subjecting them to radiation, for example, infra-red radiation or ultra-violet light.

Although the conductive inks which are used have a sufficient electrical conductivity for use in certain circumstances, the electrical conductivity has in no case been as great as the electrical conductivity of copper or other highly conductive metals. Even the conductive inks with the best performance have electrical conductivities which in most cases are only one tenth of the electrical conductivity of copper. It has been proposed to enhance the conductivity of the conductive tracks as continuous printed circuits by electro-plating the tracks with a suitable layer of metal, for example, copper but, in order to carry out electro-plating, it is necessary to have a continuous electrical circuit: that is not conveniently possible where the printed conductive tracks of a printed circuit are discrete and are not connected with one another. Furthermore, electro-plating has required the immersion of the substrate carrying the printed conductive tracks in a bath of suitable electro-plating solution: that technique restricts the substrates which can be subjected to such an immersion electro-plating technique—for example—paper based substrates are generally unsuitable as they will tend to be attacked and softened by the electro-plating solution. It has also been proposed to provide a more conductive coating on conductive tracks of printed inks by electroless plating. Electroless plating involves the use of plating solutions which are less stable than those commonly used in electro-plating and the process is less readily controlled. Furthermore, electroless plating still requires the substrate to be immersed in the plating solution with the consequent possibilities of attack of the substrate as well as being restricted in the thickness of deposit.

Thus, it would be advantageous to provide an improved method of providing conductive tracks on a printed circuit by electro-plating and to provide an improved printed circuit.

SUMMARY OF THE INVENTION

In one aspect, the invention comprises an electro-plating cell wherein the cathode connection is formed by an electron beam. The invention also provides a method of electro-plating comprising providing an anode current, applying an electron beam to the surface of a target and passing electrolyte between the target and anode, to thereby deposit material on the target.

The method may include any one or more of the following features:

Ionizing the target by treating with a scanning electron beam to create an opposite polarity to the polarity of the anode;

Providing an electrically conductive layer at the surface of the target;

Providing a layer of material of greater density than the neighbouring material;

Providing material suitable for forming a lattice with the material being deposited;

Focusing the electron beam by tuning of voltages applied within the electron gun;

Spreading of the electron beam by tuning of voltages applied within the electron gun;

Varying the position of the beam on the target;

Directing a plurality of electron beams onto one or more regions of the target;

Directing two electron beams onto a target from opposite sides of the target;

Directing and focusing two electron beams, from opposite sides of a target, to collide in the vicinity of a target;

Directing two electron beams from one side of the target, and directing one electron beam from the other side of the target;

Directing an electron beam from the region of the source of the anode current.

Also, the invention provides electro-plating apparatus comprising an anode to provide current at a target, means to apply an electron beam to the target and means to pass electrolyte between the target and anode, to thereby deposit material on the target.

The electro-plating apparatus may include any one or more of the following features:

An electro-plating cell wherein the cathode connection is formed by an electron beam;

A scanning electron beam gun to ionize a target;

Means to focus the electron beam by tuning of voltages applied within an electron gun;

Means to spread the electron beam by tuning of voltages applied within an electron gun;

Means to vary the position of the electron beam at the target;

An electron beam source to direct a plurality of electron beams to one or more regions of the target;

An electron beam source to direct at least two electron beams which are on opposite sides of the target;

Two electron beam guns positioned on opposite sides of the target for the direction and focusing of beams for collision at the target;

One electron beam source to direct an electron beam from one side of the target, and two electron beam sources to direct two electron beams from the other side of the target;

An electron beam source is located in the anode.

The invention also provides a computer product directly loadable into the internal memory of a digital computer, comprising software code portions for performing the steps of a method of the present invention when the product is run on a computer.

The invention also provides such a computer program product on a carrier, and to electronic distribution or storage of such a computer program product on a carrier.

In one aspect, the invention relates to a method of providing conductive tracks on a printed circuit by electro-plating conductive tracks which have been produced by printing them onto a substrate, comprising coating a substrate carrying the printed tracks with an electro-plating solution using a tool which provides a first electrode of an electro-plating circuit and with a second electrode provided by the tracks which are to be electroplated.

In carrying out aspects of the method in accordance with the invention ink forming the conductive tracks preferably comprises a cured polymer composition loaded with electrically conductive particles.

Conveniently in carrying out a method in accordance with aspects of the invention, a first pole of an electro-plating circuit is connected to the first electrode and a second, opposite pole of the plating circuit is connected to the second electrode.

Preferably in carrying out aspects of the method in accordance with the invention use is made of apparatus including a tool which comprises an absorptive member in which the plating solution can be carried, in which the first electrode is in electrical connection with plating solution carried by the absorptive member, and in which the coating of plating solution is applied to the substrate by wiping the absorptive member over the substrate. Conveniently, the tool also comprises a second electrode, electrically insulated from the first electrode and spaced from the absorptive member, in which the second electrode is adapted to be wiped across the surface of the substrate as the absorptive member is wiped across the surface of the substrate.

In another aspect of the method in accordance with the invention the conductive tracks may be treated with a scanning electron beam to ionize the tracks and create an opposite polarity to the polarity of the first electrode.

Conveniently in carrying out aspects of the method in accordance with the invention the plating solution comprises copper sulphate. However, any suitable electrode-plating solution which can be carried by the absorptive member may be used. In carrying out a method in accordance with the invention the conductive tracks are conveniently coated with plating solution sufficient to deposit a layer of copper on the tracks which is of a desired thickness, typically about 2 microns in thickness.

In another aspect the invention, there is provided a tool suitable for use in electro-plating electrically conductive regions of a substrate comprising an absorptive member in which the plating solution can be carried, a first electrode adapted to make electrical contact with a plating solution carried by the absorptive member, and at least one second electrode electrically insulated from the first electrode and spaced from the absorptive member, the second electrode being so positioned that as the absorptive member is wiped across a surface of a substrate the second electrode can be wiped across the surface of the substrate.

In carrying out aspects of the method in accordance with the invention, use is preferably made of a tool in accordance with the invention.

The absorptive member of a tool in accordance with the invention may be provided by any suitable means within which the plating solution may be absorbed—for example the absorptive member may comprise a brush or a flexible foam material having interconnected pores.

Suitably a tool in accordance with the invention comprises means to feed a supply of plating solution to the absorptive member.

A preferred tool in accordance with the invention comprises two electrically connected second electrodes mounted such that as the absorptive member is wiped across the surface of a substrate one of the second electrodes leads the absorptive member and the other second electrode trails the absorptive member. Conveniently, the or each second electrode is provided by a flexed electrically conductive blade, for example a flexible metal blade, e.g., of copper.

In another aspect the invention may be considered to provide a printed circuit comprising a plurality of discrete conductive tracks, each track comprising a layer of a cured electrically conductive ink on an electrically insulating substrate and a layer of conductive metal deposited on the cured ink by electro-plating.

In carrying out aspects of the method in accordance with the invention it is not necessary to immerse the substrate carrying the conductive tracks in a plating bath. The quantity of plating solution which comes into contact with the substrate is very small and the method can in effect be regarded as a substantially dry electroplating method. Consequently, it is possible to electro-plate tracks on substrates which cannot be electro-plated by an immersion system. Furthermore, in carrying out a preferred method in accordance with the invention, it is not necessary that the conductive tracks be continuous, the use of a tool in accordance with the invention or the scanning electron beam technique enables discreet electrically conductive tracks to be electro-plated. A method in accordance with the invention can be controlled to provide an accurate plating thickness: the thickness of a layer applied by electro-plating is a function of current and time for which the electro-plating solution is in contact with the region to be plated. It is therefore possible to electro-plate regions of a printed circuit to provide electro-plated regions of different thickness thereby permitting adjustment of the resistance of regions of the printed circuit to provide resistors of the circuit. Such a system is particularly conveniently carried out using the scanning electron beam which can be targeted accurately on to a specific conductive track and moved rapidly to achieve the desired conductivity.

Although in carrying out aspects of the method in accordance with the invention the tool by which the plating solution is applied may be hand held, it is preferable to mount the tool in a suitable machine which may wipe the tool across the surface of the substrate carrying the conductive tracks.

BRIEF DESCRIPTION OF THE DRAWINGS

In order that the invention may more readily be understood, a description is now given, by way of example only, reference being made to the accompanying drawings, in which:

FIG. 3 is an enlarged view of the web in FIG. 1;

DETAILED DESCRIPTION OF THE INVENTION

Figure 1:
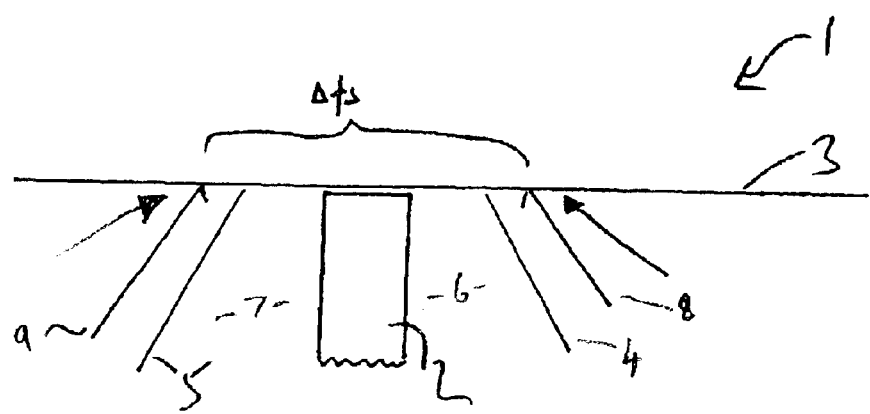
FIG. 1 is a schematic side view of a prior art electro-plating station.

FIG. 1 illustrates schematically a conventional electro-plating station 1 having an anode 2 over which web 3 passes. Seals 4 and 5 define the extremities of the inlet and outlet channels 6 and 7 for flow of electrolyte to and away from the electro-plating area of the web 3. Rows of fingers 8 and 9 provide the cathode connection.

Also the separation distance between rows of fingers 8 and 9 defines the smallest feature size Δfs which can be achieved with station 1, in that one or other of fingers 8 or 9 must be touching the feature to be plated. Typically, this distance is of the order of about $4 \times 10^{-2}$ meters.

Figure 2:
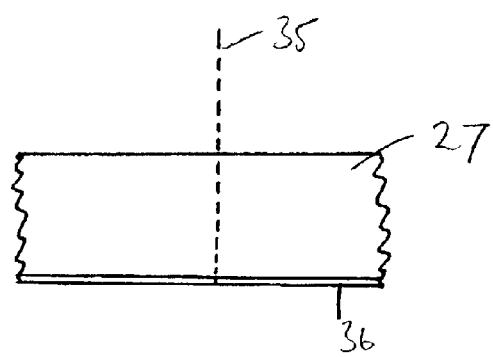
FIG. 2 is a side view of an electro-plating station of the present invention.

There is shown in FIG. 2 an electro-plating station S of the invention comprising a head 20 having an anode 21 of thickness $6 \times 10^{-3}$ meters, to one side of which there is located an electrically-neutral wall 23 with an arcute upper section 24. A passageway 25 is formed between anode 21 and wall 23 for electrolyte 26 being a solution of copper sulphate flowing at a speed of 4 litres $sec^{-1}$.

A web 27 of material of width 1 meter on which copper is to be selectively deposited, is moved at a substantially uniform speed of 0.2 meters $min^{-1}$ over head 20. Anode 21, beam 35 (see FIG. 3) and electrolyte 26 allow a current density of $1.27 \times 10^5$ Amps $meter^{-2}$ resulting in deposition of copper to a thickness of $2 \times 10^{-6}$ meters. The speed of movement of the web 27 is maintained constant, typical speeds being up to or greater than about 6 meters $min^{-1}$.

Guide 24 of wall 23 is shaped to enhance and maximize the production of streamwise vortices. Anode 21 is $6 \times 10^{-3}$ meters wide at its top surface 28 and is 1.1 meter long to accommodate the width of web 27.

Serrations (not shown) are provided on the anode 21 in the area of top surface 28, and a mesh 30 located in passageway 25 also contribute to the generation of these vortices.

Electro-plating station S has a mesh 31 located at a throat section 32 of passageway 25 shortly before the start of the guide 24, the mesh being a polyester mesh N8 type of 34.6 threads $10^{-2}$ meters with a thread diameter of $1.04 \times 10^{-4}$ meters giving a maximum open area of 38%.

Directly above top surface 28 of anode 21, and separated from top surface 28 by a minimal clearance to accommodate web 27 and electrolyte flow, is located the quartz outlet window 33 of an electron beam gun 34 which can provide electron beams with currents in the range of from less than about $10^{-6}$ Ampere to about one Ampere or greater. The beam may have a radius of as little as about $1 \times 10^{-8}$ meter and as large as about $3 \times 10^{-2}$ meter. The diameter of the beam is normally larger for higher beam currents. The cross-section of the beam need not be circular, but may have an elongated format. For example, a typical beam may have a diameter of about $1 \times 10^{-3}$ meter with a current of about $1 \times 10^{-1}$ Ampere.

In operation, electro-beam gun 34 directs a focused scanning beam 35 of electrons to a static area of typically about $1 \times 10^{-6}$ $meter^{-2}$ in layer 36 of thickness varying from less than about $1 \times 10^{-6}$ meter to greater than about $5 \times 10^{-5}$ meter on web 27 (see FIG. 3) as it passes close by top surface 28 of anode 21.

Layer 36 may be electrically-conductive, e.g., a silver-loaded ink, vapor-deposited copper or carbon-loaded ink to form a seed layer. Alternatively, it can be of other materials, typically more dense than the remainder of the web 27, and preferably suitable to form a lattice with the material being deposited (typically being copper) or any other materially used in electro-plating.

In another form, there may be no distinctive layer 36, but rather the presence of the electrolyte stream is sufficient to provide an initial basis for deposition of material. A rough surface of the web may contribute to the initial deposition of material.

The electron beam 35 from gun 34 can be focused or spread by appropriate tuning of the voltages applied within gun 34, and likewise the position of the beam can be moved in any combination of the two axes relative to the plane of web 27. Thus, by suitable varying of the size and position of the material deposited on moving web 27, actual "writing" onto the web can be achieved.

Figure 4:
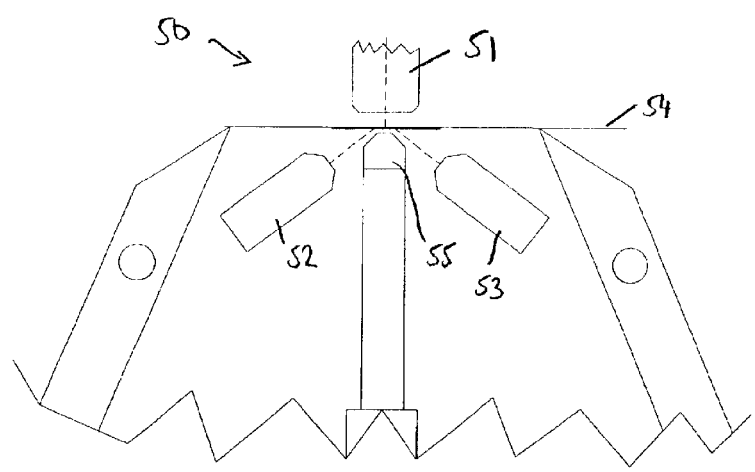
FIG. 4 shows an alternative electro-plating station.

FIG. 4 shows another electro-plating station 50 which has three electro-beam guns 51, 52 53, one gun 51 being located above web 54 and on the opposite side of it to anode 55, and two guns 52 and 53 below the web 54 and on opposing sides of anode 55. In a variant, only one of guns 52 and 53 is provided.

Figure 5:
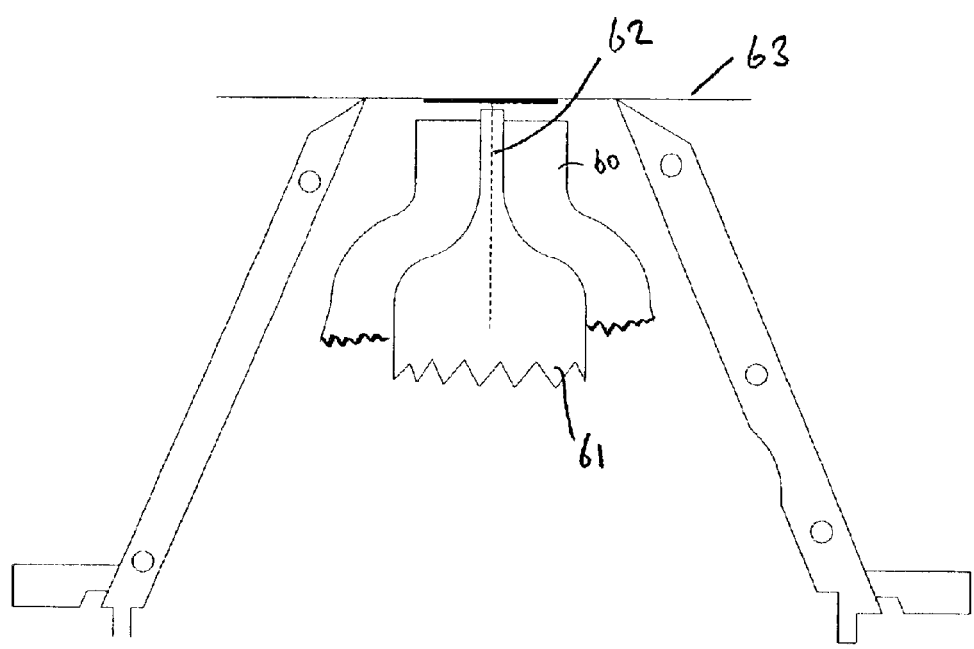
FIG. 5 shows a further alternative electro-plating station.

FIG. 5 shows another embodiment of the invention, in which anode 60 is hollow and has electron gun 61 centrally located with anode 60 such as to produce an electron beam 62 which impinges on web 63 from below.

Figure 6:
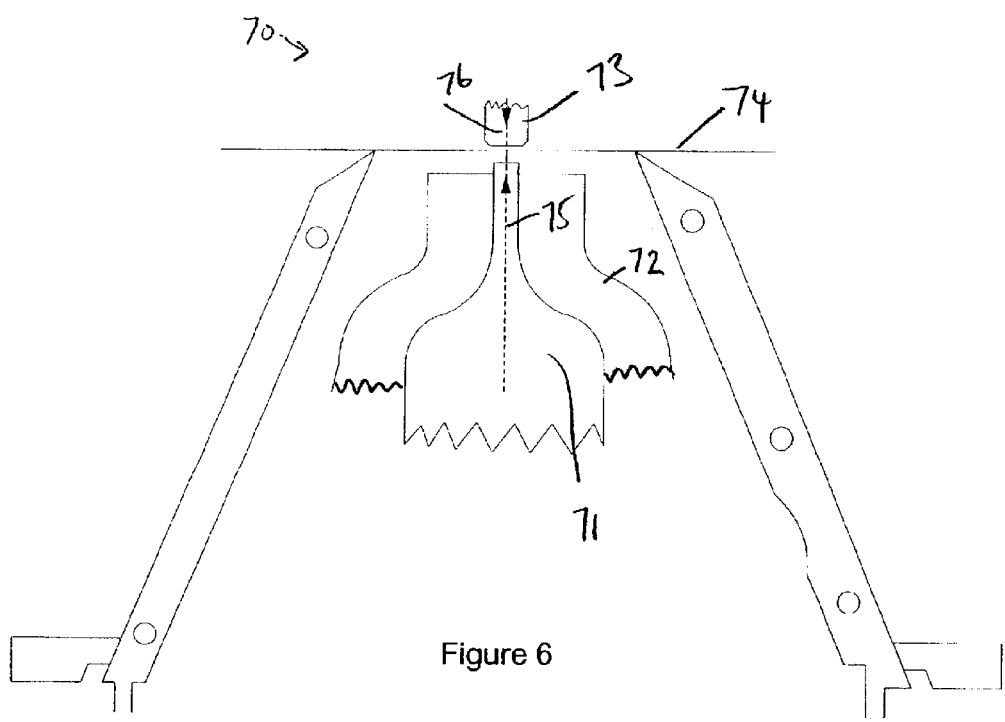
FIG. 6 shows a further alternative electro-plating station.

FIG. 6 shows a further embodiment of the invention in which electro-plating station 70 comprises a first electron beam gun 71 positioned within anode 72 in similar fashion to FIG. 5, and a second electron beam gun 73 positioned above gun 71 and on the other side of the location of the target, being the respective part of web 74. Thus, the two beams 75 and 76 are directed and focused to collide in the vicinity of the target, and thereby reduce or eliminate the need or importance of a seed layer.

The two beams may be finely focused and they may be of similar size and directed in opposition.

The invention enables easy, precise and fast deposition of material onto a fast-moving web. Moreover, the invention enables the elimination of many of the components required in some electro-plating machines, for example, seals and electrical-contacting fingers.

Electro-plating apparatus of the invention may be incorporated in an electro-plating machine comprising five in-line electro-plating stations, each being as described with reference to station S of the invention. The web passes over each of the stations in turn so that an amoutn of copper is deposited on the web at each station. The current density applied at each station can be set at an appropriate level for the amount of copper to be deposited a that station as requried.

For example, in one electro-plating operation, it may be appropriate to supply a current density of about 50 Amps $m^{-2}$ at the first station to deposit a layer of copper thickness about $3.33 \times 10^{-9}$ meters, and then to apply a current density of about 300 Amps $m^{-2}$ at each of the subsequent stations to deposit a layer of copper thickness about $2 \times 10^{-8}$ meters in each. Such a current density profile may be appropriate, for example, to ensure that current in the tracks does not burn out in a typical electroplating operation, for example with the web running at about 0.2 metre $min^{-1}$.

In another electroplating operation, it may be appropriate to apply a current density profile which alternates between high and low values and/or with time, for example to give varying deposition thickness or to change the copper characteristics.

Figure 7:
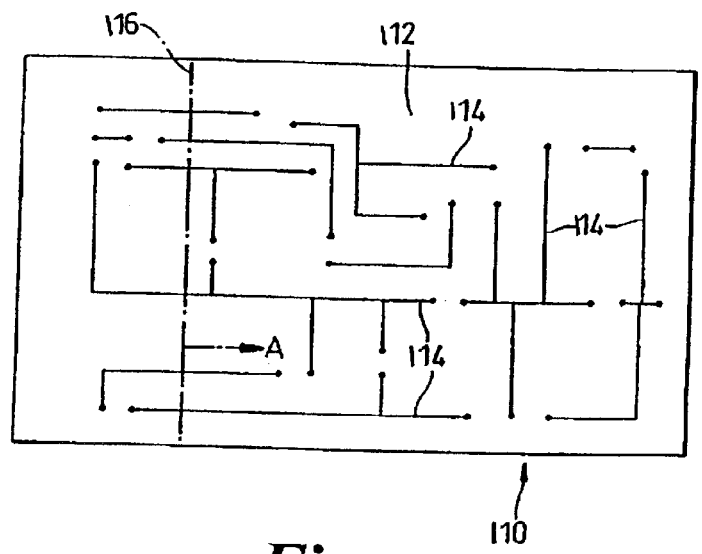
FIG. 7 shows a printed circuit.

A printed circuit 110 is shown in FIG. 7. The printed circuit comprises a substrate 112 on which are printed a plurality of conductive tracks 114. The tracks 114 are printed onto the surface of the substrate 112 using a screen printing technique, the screen printing ink being provided by a polymeric composition loaded with electrically conductive silver particles and cured by exposure to ultra-violet light to provide a pattern of discrete conductive tracks. The tracks as initially printed using the UV curable ink are of relatively low conductivity.

Figure 8:
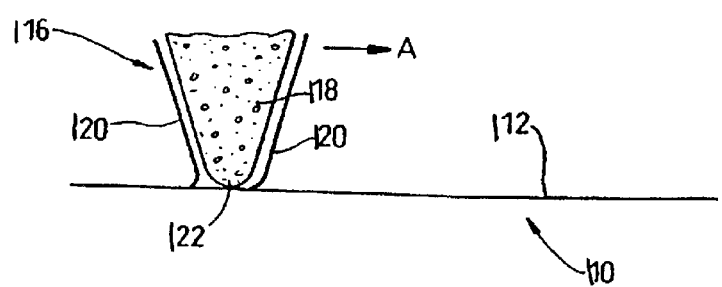
FIG. 8 shows an electro-plating head.

In carrying out the illustrative method, of enhancing the conductivity of conductive tracks which have been produced by printing them onto the substrate 112, the substrate carrying the printed tracks 114 is coated with an electro-plating solution using a tool 116 which is indicated in chain dot line on FIG. 7 and which is shown diagrammatically from the end in FIG. 8, with part broken away.

The tool 116 comprises an absorptive member 118 provided by a body of flexible foam material having interconnecting pores. The tool 116 further comprises a first electrode (not shown) which projects into the absorptive member 118. The tool further comprises a pair of second electrodes 120 mounted at either side of the absorptive member 118, closely adjacent to a tip portion 122 of the absorptive member 118, but spaced from the tip portion 122 and electrically insulated from the first electrode and from the absorptive member.

Each of the second electrodes 120 is provided by a flexible electrically conductive blade member which is made of any suitable metal material, for example, a copper alloy.

In carrying out the illustrative method which can be regarded as an specialized and innovative application of the know brush plating method, the absorptive member 118 is impregnated with an electro-plating solution so that the first electrode makes electrical contact with the solution. The tool 116 is then moved into contact with the surface of the substrate 112, with the tip region 122 of the absorptive member 118 pressing lightly on the surface of the substrate 112 and with the second electrodes likewise lightly contacting the surface of the substrate 112.

After the tool 116 has been brought into contact with the surface of the substrate 112 it is wiped along the substrate 112 in the direction indicated by the arrow A on FIGS. 7 and 8. As can be seen viewing FIG. 7, the tool 116 extends completely across the substrate 116. Electro-plating solution is supplied to the absorptive member 118 in sufficient quantity that, as the tool 116 is wiped across the surface of the substrate, a coating of electro-plating solution is wiped by the tool 116 across the surface of the substrate. The first electrode is connected to a positive pole of an electroplating circuit to provide the anode, while both of the second electrodes 120 are connected to the negative pole of the electro-plating-plating circuit to provide the cathode. Thus, as the tool 116 is wiped across the surface of the substrate, the conductive tracks 114 are electro-plated. The electrical current supplied by the electro-plating circuit, in conjunction with the speed of travel of the tool across the surface of the substrate, provides a control of the amount of electro-plating metal which is deposited on the conductive tracks and is suitably controlled to provide a layer of metal electro-plated on the conductive tracks, which is of a desired thickness, normally between about 10 and about 15 microns in thickness. Any appropriate electro-plating may be used, but a common copper sulphate electro-plating solution may be appropriate.

When the surface of the substrate 112 has been treated by the tool 116, any excess electro-plating solution may be rinsed from the surface of the substrate 112, if necessary.

As the lines printed on to the substrate 112 by the curable ink may be relatively fragile the pressure exerted by the tools 116 on the substrate should be very light, just sufficient to apply the necessary electro-plating solution and to make electrical contact between the second electrodes 120 and the conductive tracks 114.

The illustrative method provides a readily controlled method of electro-plating discrete conductive tracks carried on the surface of a printed circuit substrate. As the substrate is not immersed in an electro-plating bath, and the method is a substantially "dry" method of electro-plating, with only small amounts of electro-plating solution coming into contact with the substrate, it is possible to electro-plate substrates which would be adversely affected by immersion in an electro-plating bath. Furthermore, the method allows electro-plating of discrete conductive tracks which has not hitherto been possible in any convenient manner.

What is claimed is:

1. Electro-plating apparatus comprising:
   an anode to provide current at a target,
   means to apply an electron beam to the target; and
   means to pass electrolyte between said target and said anode, to thereby deposit material on the target.

2. The apparatus according to claim 1, further comprising an electro-plating cell, wherein the cathode connection is formed by an electron beam.

3. The apparatus according to claim 1, further comprising a scanning electron beam gun to ionize a target.

4. The apparatus according to claim 1, further comprising means to focus the electron beam by tuning of voltages applied within an electron gun.

5. The apparatus according to claim 1, further comprising means to spread the electron beam by tuning of voltages applied within an electron gun.

6. The apparatus according to claim 1, further comprising means to vary a position of the electron beam at the target.

7. The apparatus according to claim 6, further comprising two electron beam guns positioned on opposite sides of the target for direction and focusing of beams for collision at the target.

8. The apparatus according to claim 1, further comprising an electron beam source to direct a plurality of electron beams to one or more regions of the target.

9. The apparatus according to claim 1, further comprising an electron beam source to direct at least two electron beams which are on opposite sides of the target.

10. The apparatus according to claim 1, further comprising one electron beam source to direct an electron beam from one side of the target, and two electron beam sources to direct two electron beams from another side of the target.

11. The apparatus according to claim 1, wherein an electron beam source is located in the anode.

\* \* \* \* \*